United States Patent
Turchi et al.

(10) Patent No.: US 9,594,099 B2
(45) Date of Patent: Mar. 14, 2017

(54) METHOD OF AND CIRCUIT FOR BROWN-OUT DETECTION

(71) Applicant: Semiconductor Components Industries, LLC, Phoenix, AZ (US)

(72) Inventors: Joel Turchi, Gagnac sur Garonne (FR); Karel Ptacek, Roznov Pod Radhostem (CZ); Radim Mlcousek, Frenstat pod Radhostem (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 311 days.

(21) Appl. No.: 14/336,665

(22) Filed: Jul. 21, 2014

(65) Prior Publication Data
US 2015/0028916 A1  Jan. 29, 2015

Related U.S. Application Data

(62) Division of application No. 13/264,150, filed on Oct. 12, 2011, now Pat. No. 8,786,297.

(51) Int. Cl.
*G01R 19/165* (2006.01)
*G01R 19/00* (2006.01)
*G01R 31/40* (2014.01)

(52) U.S. Cl.
CPC ... *G01R 19/16538* (2013.01); *G01R 19/0084* (2013.01); *G01R 31/40* (2013.01)

(58) Field of Classification Search
CPC ...... G01R 15/12; G01R 15/144; G01R 19/00; G01R 19/30; G01R 21/06; G01R 31/261;
(Continued)

(56) References Cited

U.S. PATENT DOCUMENTS 3,651,470 A * 3/1972 Healey ............. G01R 19/16576
340/13.38
4,544,893 A * 10/1985 Takahashi .............. G01R 13/02
324/433

(Continued)

OTHER PUBLICATIONS

Renesas, R2A20112SP/DD, "Critical Conduction Mode Interleaved PFC Control IC", REJ03D0904-0200 Rev.2.00, Nov. 13, 2007.
(Continued)

*Primary Examiner* — Tung X Nguyen
*Assistant Examiner* — Robert P Alejnikov, Jr.
(74) *Attorney, Agent, or Firm* — Rennie William Dover

(57) ABSTRACT

A circuit and method for detecting a brown-out condition and providing a feed-forward transfer function in a power supply circuit. A comparison circuit is coupled to a delay element through a latch. A second delay element is connected between the first delay element and an input of the latch. The output of the first delay element is connected to a clamping circuit via a logic circuit. A first voltage is compared with a reference voltage to generate a comparison voltage, which is transmitted through the latch and the first delay element. The comparison voltage is monitored at an output of the first delay element. A brown-out condition occurs if the comparison voltage being monitored at the output of the first delay element results from the first voltage being less than the reference voltage.

11 Claims, 4 Drawing Sheets

(58) Field of Classification Search
CPC .... G01R 31/2623; G01R 31/40; G01R 31/42;
G01R 19/00381; G01R 17/00; G01R
19/165; G01R 19/16566; G01R 19/16504;
G01R 19/0038; H03K 5/1532; H03K
5/24; H03F 2203/45106; H03F
2203/45218; G05F 1/10; G05F 1/46;
G05F 3/02; G11C 5/147
USPC ...... 324/76.11, 157, 764.01; 327/50, 63, 72,
327/77, 80, 321, 530
See application file for complete search history.

(56) References Cited

U.S. PATENT DOCUMENTS

| | | | |
|---|---|---|---|
| 4,706,138 A * | 11/1987 | Jove | G01R 33/09 360/67 |
| 5,319,514 A | 6/1994 | Walsh et al. | |
| 5,606,511 A | 2/1997 | Yach | |
| 5,699,003 A | 12/1997 | Saeki | |
| 5,838,171 A * | 11/1998 | Davis | G01R 19/16538 327/19 |
| 5,943,635 A | 8/1999 | Inn | |
| 6,933,706 B2 | 8/2005 | Shih | |
| 2005/0151567 A1* | 7/2005 | Shimada | G01R 19/16538 327/78 |
| 2005/0270890 A1 | 12/2005 | Kim | |
| 2006/0229830 A1* | 10/2006 | Saether | G11O 5/143 702/59 |
| 2008/0030191 A1 | 2/2008 | Nishikawa | |
| 2009/0034139 A1* | 2/2009 | Martin | H02H 9/046 361/91.1 |

OTHER PUBLICATIONS

Texas Instruments, UCC28060, Natural Interleaving Dual-Phase Transition-Mode PFC Controller, slus767e—May 2007—Rev. Nov. 2008 www.ti.com.

* cited by examiner

METHOD OF AND CIRCUIT FOR BROWN-OUT DETECTION

The present application is a continuation application of U.S. patent application Ser. No. 13/264,150 filed on Oct. 12, 2011, by Joel Turchi et al., titled "METHOD OF AND CIRCUIT FOR BROWN-OUT DETECTION" which is hereby incorporated by reference in its entirety, and priority thereto for common subject matter is hereby claimed.

BACKGROUND

The present invention relates, in general, to power supplies and, more particularly, to brown-out detection and feed-forward circuitry in power supplies. Voltage regulators that provide AC/DC rectification typically include a full wave voltage rectifier stage such as, for example, a diode bridge, a main Switch Mode Power Supply (SMPS) stage, and a Power Factor Correction (PFC) stage inserted between the line and the main SMPS. The SMPS provides regulation of an output waveform and the PFC stage draws a sinusoidal current from the line and provides Direct Current (DC) voltage to the main SMPS. For many systems to operate properly, it is desirable for the PFC stage to include a feed-forward circuit and a brown-out detection circuit. The feed-forward circuit provides an input-to-output transfer function that is independent of the input voltage which eases loop compensation whereas the brown-out detection circuit disables the converter if the line magnitude is too low. What is more, it is desirable for the brown-out detection circuit to include a hold-time component to ignore short interruptions to the mains, thereby allowing the power supply to continue operating when these short interruptions occur. Typically, brown-out detection circuits capable of ignoring short mains interruptions are comprised of filter circuits. A drawback with using filter circuits is that they degrade the response to line variations because the brown-out detection circuit and the feed-forward circuit receive input signals from a common input pin. Thus, designers have had to trade-off the performance of feed-forward circuitry with the performance of brown-out detection circuits.

Accordingly, it would be advantageous to have a circuit and method for detecting brown-out conditions that meet desired hold-time specifications and that are capable of providing a feed-forward transfer function that is independent of the line magnitude. It would be of further advantage for the circuit and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
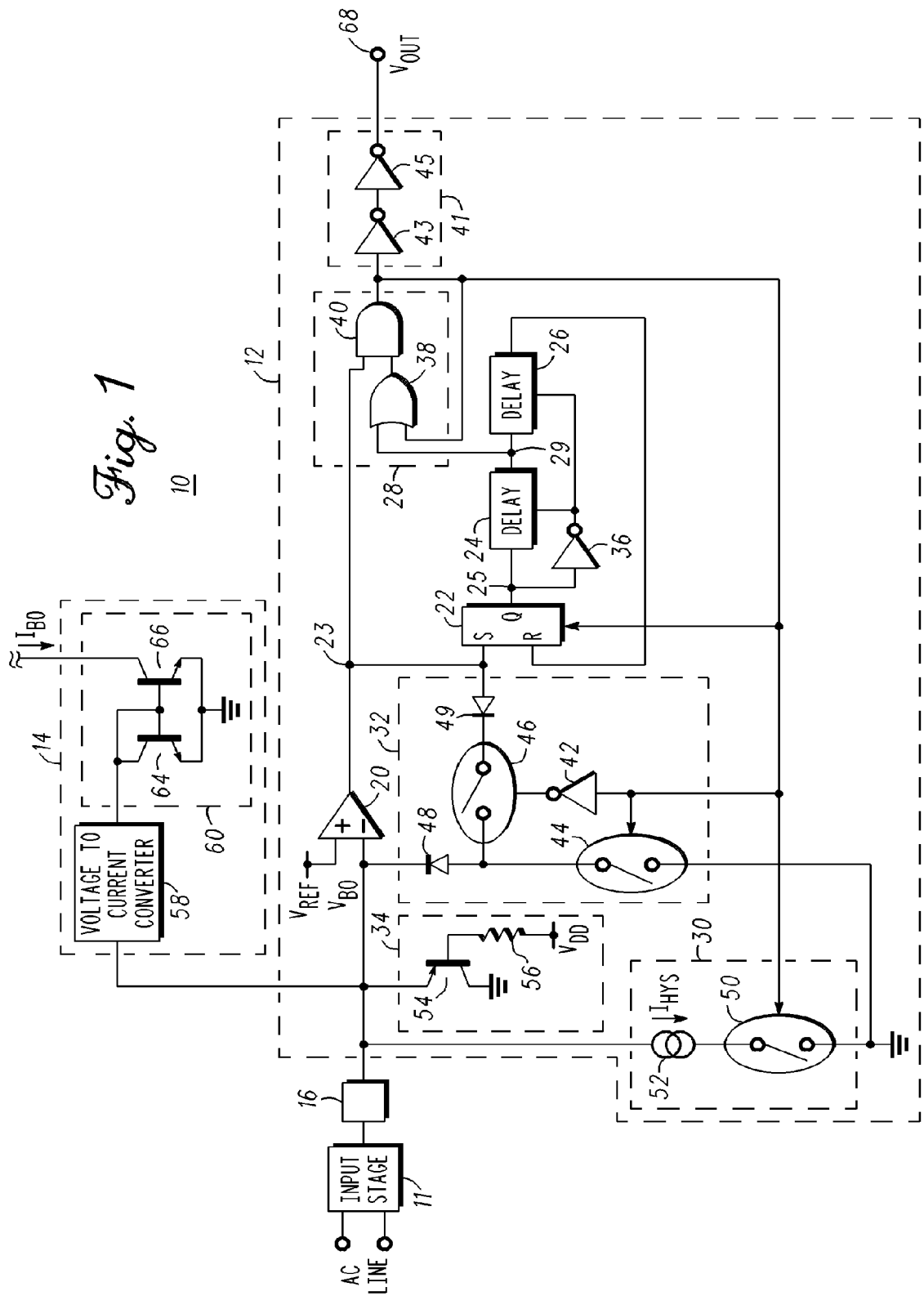
FIG. 1 is a schematic diagram of a circuit for use in power supply applications in accordance with an embodiment of the present invention.

FIG. 1 is a schematic diagram of a circuit 10 suitable for use in power supply applications in accordance with embodiments of the present invention. Circuit 10 includes a brown-out detection circuit 12 and a feed-forward circuit 14 coupled to an input/output node 16. Input/output node 16 is also referred to as brown-out node and may be, for example, an input/output pin. Brown-out node 16 is coupled to an AC line through an input stage 11. Brown-out detection circuit 12 includes a circuit element such as, for example, an operational amplifier 20, a latch 22, delay elements 24 and 26, a logic circuit 28, a hysteresis circuit 30, a clamping circuit 32, and an auxiliary clamping circuit 34. Latch 22 is also referred to as a latching circuit and delay elements 24 and 26 are also referred to as delay circuits. More particularly, operational amplifier 20 has a noninverting input coupled for receiving a reference potential $V_{REF}$, an inverting input connected to brown-out node 16, and an output connected to an input of latch 22, to an input of logic circuit 28, and to an input of clamping circuit 32. The connection of the output of operational amplifier 20, the input of latch 22, and the input of logic circuit 28 form a node 23. An output of latch 22 is connected to an input of delay element 24 and to the reset inputs of delay elements 24 and 26 through an inverter 36. The connection of the output of latch 22 and the inputs of delay element 24 and inverter 36 form a node 25. An output of delay element 24, an input of delay element 26, and an input of logic circuit 28 are commonly connected together forming a node 29. The output of delay element 26 is connected in a feedback configuration to a reset input of latch 22. By way of example, delay elements 24 and 26 introduce a blanking delay and a monitoring window, respectively, of about 100 milliseconds (msec) each. The lengths of the blanking delay and monitoring window are not limitations of the present invention. In addition, the blanking delay and monitoring window of the respective delay elements 24 and 26 are not limited to being the same length of time. In other words, the blanking delay of delay element 24 may be longer than the monitoring window of delay element 26 or the monitoring window of delay element 26 may be longer than the blanking delay of delay element 24. Delay elements 24 and 26 may be replaced by a single delay element.

In accordance with an embodiment, logic circuit 28 comprises a two-input OR gate 38 connected to a two-input AND gate 40 where an input of AND gate 40 serves as the input of logic circuit 28 that is connected to the output of operational amplifier 20 and an input of OR gate 38 serves as the input of logic circuit 28 that is connected to the output of delay element 24 and to the input of delay element 26 to form node 29. The output of OR gate 38 is connected to the other input of AND gate 40 and the output of AND gate 40 is connected to the other input of two-input OR gate 38.

An output drive stage 41 is connected to the output of logic circuit 28. By way of example, output drive stage 41 has an input connected to the output of logic circuit 28 and an output that serves as an output node 68. In accordance with an embodiment, output drive stage 41 is comprised of series connected inverters 43 and 45. Output drive stage 41 provides a delay in an output signal traveling from the output of logic circuit 28 to output node 68. The number of series connected inverters is not a limitation of the present invention.

Clamping circuit 32 is comprised of an inverter 42 having an input connected to the output of logic circuit 28 and coupled for controlling a switch 44. The output of inverter 42 is coupled for controlling a switch 46. Switch 44 has a terminal coupled for receiving a source of operating potential such as, for example, ground, and a terminal commonly connected to a terminal of switch 46 and to an anode of a diode 48. The cathode of diode 48 is connected to the inverting input of operational amplifier 20. The output of operational amplifier 20 is coupled to a terminal of switch 46 through a diode 49. The anode of diode 49 is commonly connected to the output of operational amplifier 20 and to an input of latch 22 and to an input of logic circuit 28.

Hysteresis circuit 30 is comprised of a switch 50 having a terminal coupled for receiving a source of operating potential such as, for example, ground, and a terminal coupled to the inverting input of operational amplifier 20 through a current source 52. A control terminal of switch 50 is connected to the output of logic circuit 28.

Auxiliary clamping circuit 34 is comprised of a PNP bipolar transistor 54 having an emitter commonly connected to the inverting input of operational amplifier 20, to the cathode of diode 48, and to brown-out node 16. The collector of PNP bipolar transistor 54 is coupled for receiving a source of operating potential such as, for example, ground and the base of PNP bipolar transistor 54 is coupled for receiving a source of operating potential such as, for example, $V_{DD}$, through a resistor 56.

Feed-forward circuit 14 includes a voltage-to-current converter 58 having an input commonly connected to the inverting input of operational amplifier 20, to the emitter of PNP bipolar transistor 54, to the cathode of diode 48 and to brown-out node 16. An output of voltage-to-current converter 58 is connected to a current mirror 60 that sinks a current $I_{BO}$. Current mirror 60 is comprised of NPN bipolar transistors 64 and 66, where the emitters of NPN bipolar transistors 64 and 66 are commonly connected together for receiving a source of operating potential such as, for example, ground, and their bases are commonly connected to each other and to the collector of NPN bipolar transistor 64. Voltage-to-current converter 58 generates a current $I_{DO}$ that is proportional to the voltage at brown-out node 16. The voltage appearing at brown-out node 16 is referred to as the brown-out voltage and is an averaged portion of the input voltage. Feed-forward circuit 14 makes the transfer function and the power delivery independent of the AC line level.

Figure 2:
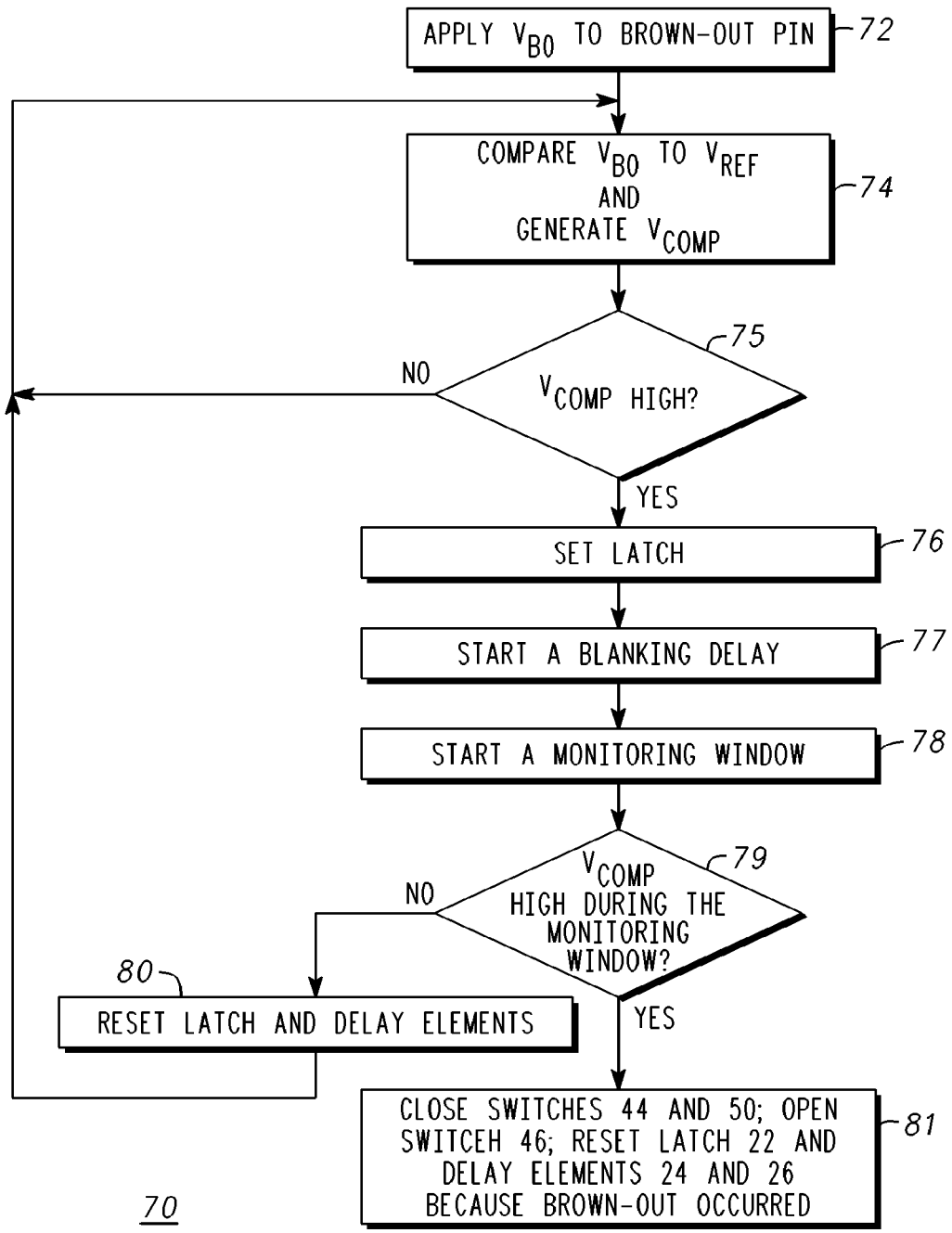
FIG. 2 is a flow diagram illustrating a method for detecting a brown-out condition in accordance with embodiments of the present invention.

FIG. 2 is a flow diagram 70 illustrating the operation of brown-out detection circuit 12 in accordance with embodiments of the present invention. A voltage $V_{BO}$ that is a portion of an input voltage from an input stage 11 is applied to brown-out node 16 (indicated by box 72). Voltage $V_{BO}$ is compared with a reference voltage $V_{REF}$ by operational amplifier 20, which generates a comparison voltage $V_{COMP}$ at its output, i.e., node 23, (indicated by box 74). By way of example, reference voltage $V_{REF}$ is one volt. If voltage $V_{BO}$ is greater than reference voltage $V_{REF}$, comparison voltage $V_{COMP}$ is a logic low voltage and if voltage $V_{BO}$ is less than reference voltage $V_{REF}$, comparison voltage $V_{COMP}$ is a logic high voltage. When comparison voltage $V_{COMP}$ is a logic high voltage, it is substantially equal to reference voltage $V_{REF}$ plus the forward voltage drops across two series connected diodes. It should be noted that comparison voltage $V_{COMP}$ is also referred to as an operational amplifier output signal when an operational amplifier makes the comparison.

In response to comparison voltage $V_{COMP}$ being a logic low voltage, brown-out detection circuit 12 continues to compare brown-out voltage $V_{BO}$ with reference voltage $V_{REF}$ and generates or updates comparison voltage $V_{COMP}$ (indicated by decision diamond 75 and box 74). If comparison voltage $V_{COMP}$ is a logic high voltage, latch 22, i.e., voltage $V_{BO}$ at node 25, is set to a logic high voltage (indicated by decision diamond 75 and box 76). In addition, each time the output (node 25) of latch 22 transitions to a logic high voltage level, a blanking period starts (indicated by box 77). As discussed above, the length of the blanking delay may be, for example, 100 msec. However, the duration or length of the blanking delay is not a limitation of the present invention. The voltage at node 29 is a logic low voltage during the blanking time and turns to a logic high voltage at the end of the blanking time. The blanking time is a predetermined delay that precludes any transient changes in voltage $V_{BO}$ from being detected and identified as a fault or brown-out condition. At the end of the blanking time, brown-out detection circuit 12 starts a monitoring window during which comparison voltage $V_{COMP}$ is monitored (indicated by box 78). If comparison voltage $V_{COMP}$ is low for the whole monitoring window (indicated by decision diamond 79), brown-out detection circuit 12 resets latch 22 and delay elements 24 and 26 (indicated by box 80) after the monitoring window ends. Then brown-out detection circuit 12 continues to compare brown-out voltage $V_{BO}$ to reference voltage $V_{REF}$ and generates or updates comparison voltage $V_{COMP}$ (indicated by decision diamond 75 and box 74).

If comparison voltage $V_{COMP}$ is high at any time during the monitoring window, switches 44 and 50 are closed, switch 46 is opened, latch 22 is reset, and delay elements 24 and 26 are reset (indicated by box 81). Thus, latch 22 is reset at the end of the monitoring window delay or if a brown-out fault or condition has occurred. The voltage level at node 29 indicates whether a monitoring window is operating within brown-out detection circuit 12. The voltage at node 29 is at a logic high voltage level during the monitoring window and a logic low voltage level during the rest of the time, including during the blanking delay.

It should be noted that a logic low voltage level at the control terminals of switches 44, 46, and 50 opens them and a logic high voltage level at the control terminals of switches 44, 46, and 50 closes them.

If voltage $V_{BO}$ is higher than reference voltage $V_{REF}$, brown-out detection circuit 12 closes switch 46 and opens switches 44 and 50. If voltage $V_{BO}$ becomes less than reference voltage $V_{REF}$, switch 46 being closed and switch 44 being open, the inverting input of operational amplifier 20 is clamped at a voltage that is about two diode voltage drops below comparison voltage $V_{COMP}$. Closing switch 46 and opening switch 44 clamps the voltage at the inverting input of operational amplifier 20 at a voltage $V_{CLAMP}$ that is about the same voltage as reference voltage $V_{REF}$. Clamping the voltage at the inverting input of operational amplifier 20 forces a minimum voltage on brown-out node 16 and therefore on the inverting input of operational amplifier 20. Closing switch 50 enables current source 52 to conduct a current $I_{HYS}$, which provides programmable hysteresis. By way of example, current source $I_{HYS}$ conducts a current of about 7 microamperes. When the voltage appearing at node 29, i.e., the output of delay element 24, is at a logic high voltage level and comparison voltage $V_{COMP}$ appearing at the output of operational amplifier 20 is at a logic high voltage level, the voltage at the output of logic circuit 28 and output voltage $V_{OUT}$ at output node 68 are set to logic high voltage levels. Thus, the voltage at node 29 and the comparison voltage $V_{COMP}$ are monitored and a brown-out condition occurs if the voltage being monitored at node 29 and the comparison voltage results from voltage $V_{BO}$ being less than the reference voltage $V_{REF}$.

When a brown-out condition occurs, circuit 10 clamps brown-out node 16 at a clamping voltage so that it does not fall below reference voltage $V_{REF}$. This voltage is, however, low enough so that $V_{COMP}$ is a logic high voltage.

It should be noted that auxiliary clamping circuit 34 is included to provide an auxiliary clamping voltage that clamps, maintains, or holds brown-out node 16 at a voltage level that is less than or equal to reference voltage $V_{REF}$ when the voltage level of the supply voltage for circuit 10 is too low or too high, rendering circuit 10 unable to control a brown-out block state, i.e. the power supply voltage is unsuitable for proper operation.

Output drive stage 41 is included to provide a delay so that latch 22 and delay elements 24 and 26 are reset, and current source 52 is enabled before a fault signal is provided to the rest of the power supply control circuitry. It should be noted that current source 52 is in an enabled configuration when a fault is detected.

Figure 3:
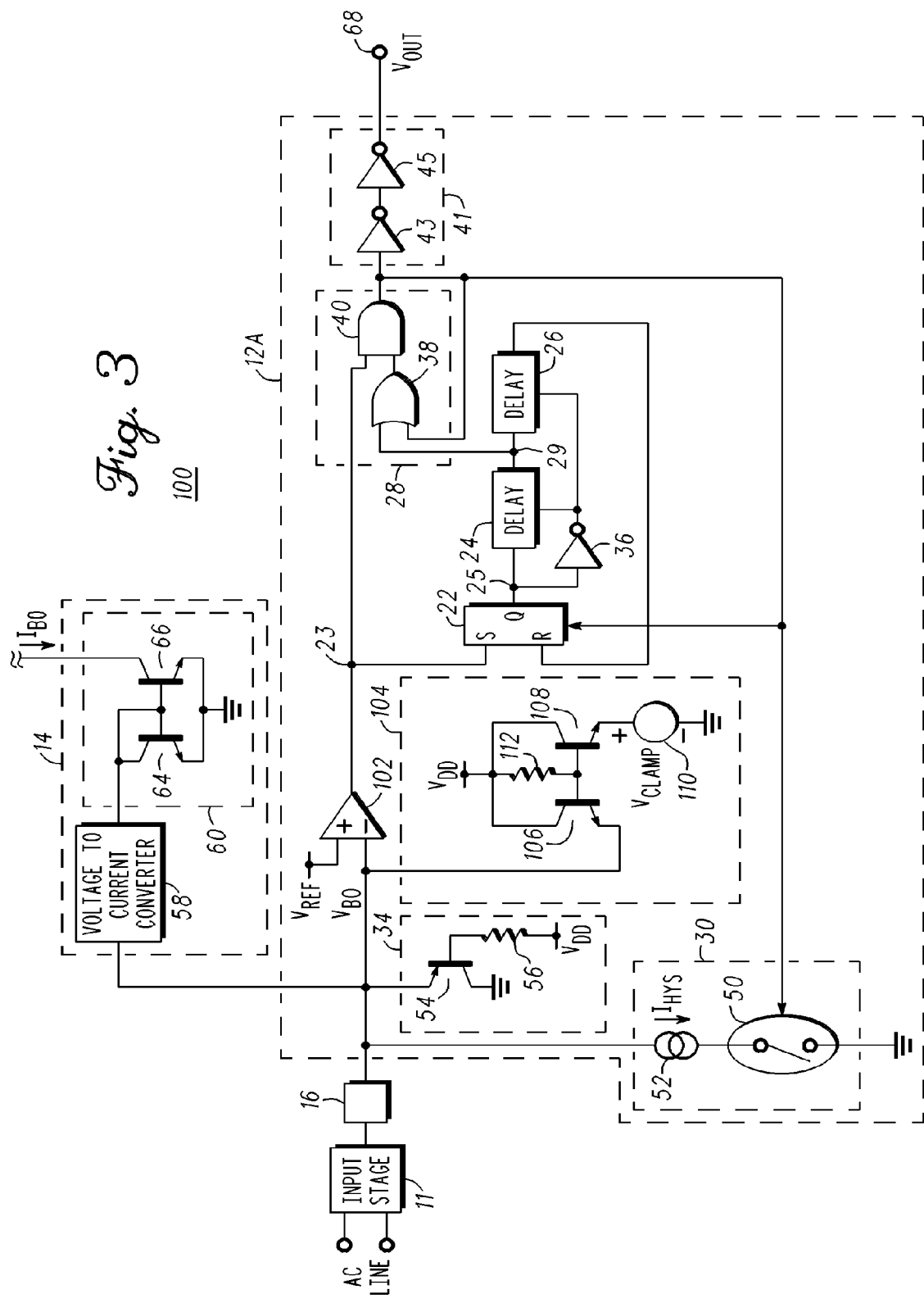
FIG. 3 is a schematic diagram of a circuit for use in power supply applications in accordance with an embodiment of the present invention.

FIG. 3 is a schematic diagram of a circuit 100 suitable for use in power supply applications in accordance with additional embodiments of the present invention. Circuit 100 is similar to circuit 10 except that in circuit 100 operational amplifier 20 is replaced by a circuit element such as, for example, a comparator 102 and clamping circuit 32 is replaced by clamping circuit 104. Because of these differences, the brown-out detection circuit of FIG. 3 has been identified by reference character 12A, i.e., the letter A has been appended to reference character 12 to distinguish the brown-out detection circuits of FIGS. 1 and 3 from each other. More particularly, comparator 102 has a noninverting input coupled for receiving a reference potential $V_{REF}$, an inverting input connected to brown-out node 16, and an output commonly connected to an input of latch 22 and to an input of logic circuit 28. The connection of the output of comparator 102, the input of latch 22, and the input of logic circuit 28 form a node 23. Clamping circuit 104 is comprised of NPN bipolar transistors 106 and 108 having base terminals commonly connected together and collector terminals commonly connected together. The emitter terminal of NPN bipolar transistor 106 is connected to the inverting input terminal of comparator 102 and the emitter terminal of NPN bipolar transistor 108 is coupled for receiving a clamping voltage $V_{CLAMP}$ from a voltage source 110. A resistor 112 is coupled between the commonly connected base terminals and the commonly connected collector terminals. The commonly connected collector terminals are coupled for receiving a source of operating potential such as, for example, a voltage $V_{DD}$. Similar to circuit 10, auxiliary clamping circuit 34 is included to clamp brown-out node 16 at a voltage level that is below reference voltage $V_{REF}$ when the voltage level of the supply voltage for circuit 10 is too low or too high, rendering circuit 10 unable to control a brown-out block state, i.e. the power supply voltage is unsuitable for proper operation.

Figure 4:
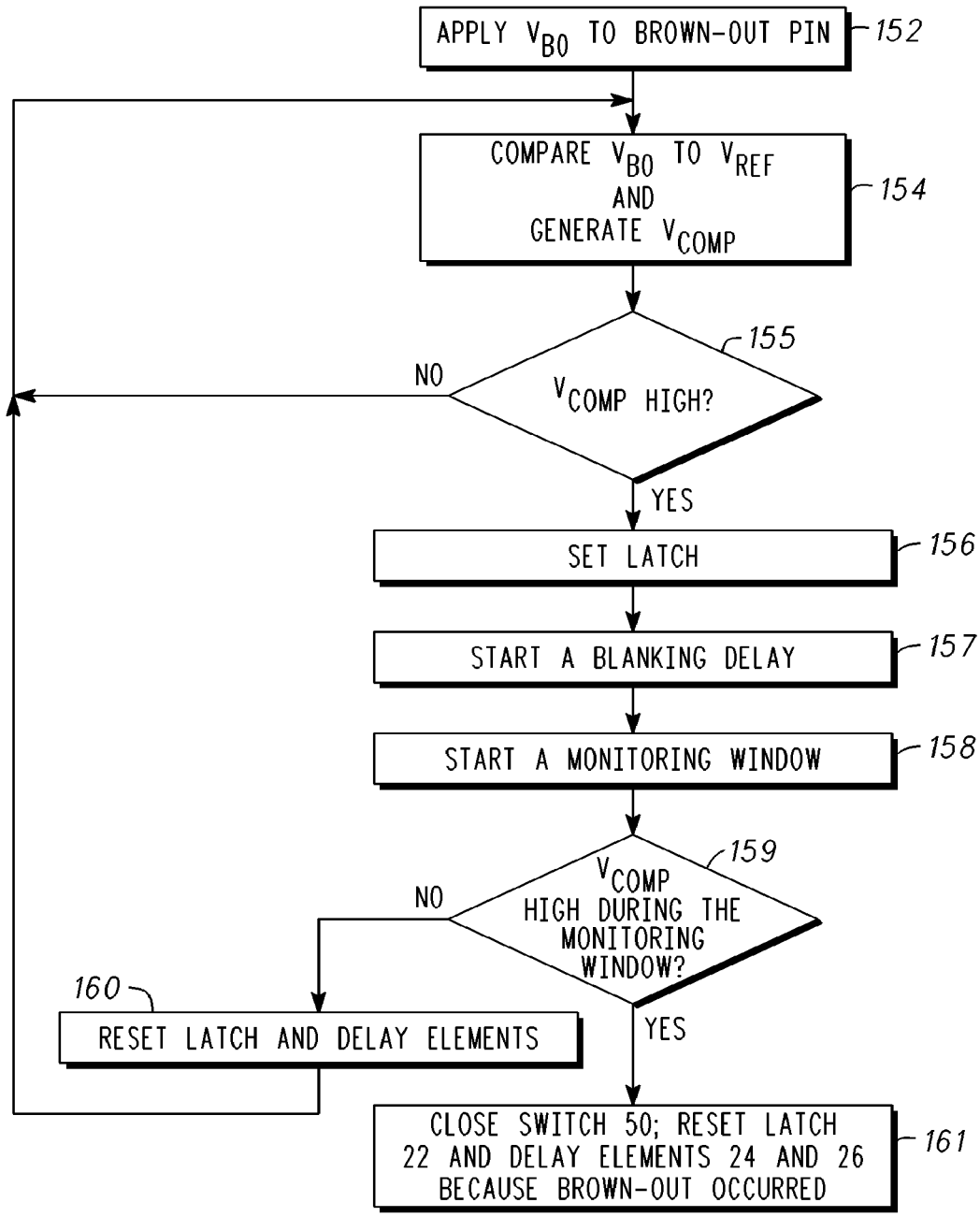
FIG. 4 is a flow diagram illustrating a method for detecting a brown-out condition in accordance with embodiments of the present invention.

FIG. 4 is a flow diagram 150 illustrating the operation of brown-out detection circuit 12A in accordance with embodiments of the present invention. A voltage $V_{BO}$ that is a portion of an input voltage from an input stage 11 is applied to brown-out node 16 (indicated by box 152). Voltage $V_{BO}$ is compared with a reference voltage $V_{REF}$ by comparator 102, which generates a comparison voltage $V_{COMP}$ at its output, i.e., node 23, (indicated by box 154). By way of example, reference voltage $V_{REF}$ is one volt. If voltage $V_{BO}$ is less than reference voltage $V_{REF}$, comparator output signal $V_{COMP}$ is a logic high voltage and if voltage $V_{BO}$ is greater than reference voltage $V_{REF}$, comparator output signal $V_{COMP}$ is a logic low voltage.

In response to comparison voltage $V_{COMP}$ being a logic low voltage, brown-out detection circuit 12A continues to compare brown-out voltage $V_{BO}$ to reference voltage $V_{REF}$ and generates or updates comparison voltage $V_{COMP}$ (indicated by box 154 and decision diamond 155). If comparison voltage $V_{COMP}$ is a logic high voltage, latch 22, i.e., voltage $V_{LATCH}$ at node 25, is set to a logic high voltage (indicated by decision diamond 155 and box 156). In addition, each time the output (node 25) of latch 22 transitions to a logic high voltage level, a blanking period is started (indicated by box 157). As discussed above, the length of the blanking delay may be, for example, 100 msec. However, the duration or length of the blanking delay is not a limitation of the present invention. The voltage at node 29 is a logic low voltage during the blanking time and turns to a logic high voltage at the end of the blanking time. The blanking time is a predetermined delay that precludes any transient changes in voltage $V_{BO}$ from being detected and identified as a fault or brown-out condition. At the end of the blanking time, brown-out detection circuit 12A starts a monitoring window during which comparison voltage $V_{COMP}$ is monitored (indicated by box 158). If comparison voltage $V_{COMP}$ is low for the whole monitoring window (indicated by decision diamond 159), brown-out detection circuit 12A resets latch 22 and delay elements 24 and 26 (indicated by box 160) after the monitoring window ends. Then brown-out detection circuit 12A continues to compare brown-out voltage $V_{BO}$ with reference voltage $V_{REF}$ and generates or updates comparison voltage $V_{COMP}$ (indicated by box 154 and decision diamond 155). If comparison voltage $V_{COMP}$ is high at any time during the monitoring window, brown-out detection circuit 12A closes switch 50, resets latch 22, and resets delay elements 24 and 26 (indicated by box 161). Thus, latch 22 is reset at the end of the monitoring window delay or if a brown-out fault or condition has occurred. The voltage level at node 29 indicates whether a monitoring window is operating within brown-out detection circuit 12A. The voltage at node 29 is at a logic high voltage level during the monitoring window and a logic low voltage level during the rest of the time, including during the blanking delay. The voltage at node 29 and the comparison voltage $V_{COMP}$ are monitored and a brown-out condition occurs if the voltage being monitored at node 29 and the comparison voltage results from voltage $V_{BO}$ being less than the reference voltage $V_{REF}$.

If reference voltage $V_{BO}$ is less than voltage $V_{REF}$, NPN bipolar transistor 106 turns on, resulting in voltage source 110 clamping the inverting input of comparator 102 at voltage level $V_{CLAMP}$. It should be noted that clamping voltage $V_{CLAMP}$ is a minimum voltage that is forced on brown-out node 16. By way of example, reference voltage $V_{REF}$ is about 1 volt and clamping voltage $V_{CLAMP}$ is about 980 millivolts (mV). The voltage level of clamping voltage $V_{CLAMP}$ is selected so that it is lower than reference voltage $V_{REF}$. Thus, comparator output signal $V_{COMP}$ is at a logic high voltage level during clamping of the brown-out voltage $V_{BO}$. Closing switch 50 enables current source 52 to conduct current $I_{HYS}$, which provides programmable hysteresis. By way of example, current source $I_{HYS}$ conducts a current of about 7 microamperes.

Output drive stage 41 is included to provide a delay so that the output of comparator 102 can be separated from brown-out pin 16 when latch 22 and delay elements 24 and 26 are reset and current source 52 is enabled.

By now it should be appreciated that brown-out detection circuits and a method for detecting the occurrence of a brown-out fault or a brown-out condition have been provided. If a voltage at the input of the brown-out detection circuit falls below a reference voltage, a comparison signal $V_{COMP}$ having a logic high voltage level is generated. A delay or blanking time is introduced into the brown-out detection signal path to allow for short interruptions of the mains. Another delay time is included after the blanking delay to serve as a monitoring window. If comparison signal $V_{COMP}$ becomes a logic high voltage during the monitoring window, a fault is detected.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for detecting a brown-out condition, comprising:
providing a comparator having a first input, a second input, and an output, a latch having a first input, a second input, and an output, a first delay circuit having a first input, a reset input, and an output, and a second delay circuit having a first input, a reset input, and an output, the output of the comparator coupled to the first input of the latch, the first input of the first delay circuit coupled to the output of the latch, the first input of the second delay circuit coupled to the output of the first delay circuit, the output of the latch coupled to the reset input of the first delay circuit and to the reset input of the second delay circuit through an inverter, and the output of the second delay circuit is coupled to the second input of the latch;
generating a comparison voltage at the output of the comparator by comparing a first voltage appearing at the first input of the comparator with a reference voltage appearing at the second input of the comparator;
latching the comparison voltage to the first input of a first delay circuit;
starting the first delay circuit in response to the latched comparison voltage to generate a first delayed latched comparison voltage, after a first delay time, at the first input of a second delay circuit;
starting the second delay circuit to generate a second delayed latched comparison voltage, after a second delay time, at the second input of the latch;
detecting a fault condition in response to the comparison voltage being at a first level.

2. The method of claim 1, wherein latching the comparison voltage to generate a latched voltage includes latching a logic high voltage in response to the first voltage being less than the reference voltage.

3. The method of claim 1, wherein latching the comparison voltage to generate a latched voltage includes latching a logic low voltage in response to the first voltage being greater than the reference voltage.

4. The method of claim 1, further including enabling a current source coupled to the first input of the comparator to conduct a current which provides programmable hysteresis for clamping the first input at the reference voltage.

5. The method of claim 1, further including resetting the voltage at the first input of the second delay circuit after the second delay time.

6. A method for detecting a brown-out condition, comprising:
providing a comparator, a latch, a first delay circuit, and a second delay circuit, wherein the comparator has an inverting input, a noninverting input, and an output, the latch has a first input, a second input, and an output, the first delay circuit has a first input, a second input, and an output, and the second delay circuit has a first input, a second input, and an output, and wherein the output of the comparator is coupled to a first input of the latch, the output of the latch is coupled to the first input of the first delay circuit, the output of the latch is coupled to the second input of the first delay circuit and to the second input of the second delay circuit through an inverter, the output of the first delay circuit is coupled to the first input of the second delay circuit, and the output of the second delay circuit is coupled to the second input of the latch;
generating a first voltage at the output of the comparator in response to comparing a second voltage at the inverting input of the comparator to a third voltage at the noninverting input of the comparator;
latching the first voltage to the output of the latch;
generating a first delayed latched voltage at the output of the first delay circuit after a first delay time;
generating a second delayed latched voltage at the output of the second delay circuit after a second delay time; and
clamping one of the inverting input or the noninverting input of the comparator to a fourth voltage that is less than the third voltage in response to the first voltage being at a first level.

7. The method of claim 6, wherein latching the first voltage to the output of the latch includes latching a logic high voltage level.

8. The method of claim 7, further including resetting the output of the latch after the second delay time has elapsed.

9. The method of claim 6, further including activating a hysteresis circuit in response to the first delayed latched voltage at the output of the first delay circuit, the hysteresis circuit coupled to the inverting input of the comparator.

10. The method of claim 6, further including generating a feed-forward signal from a portion of the second voltage, wherein the portion of the second voltage appears at one of the inverting input or the noninverting input of the comparator.

11. The method of claim 6, further including generating an auxiliary clamping voltage at the one of the inverting input or the noninverting input of the comparator in response to a power supply voltage being one of too high or too low.

* * * * *